United States Patent
Melzer et al.

(10) Patent No.: US 6,844,994 B2
(45) Date of Patent: Jan. 18, 2005

(54) OPTICAL ELEMENT DEFORMATION SYSTEM

(75) Inventors: Frank Melzer, Utzmemmingen (DE); Michael Mühlbeyer, Aalen (DE); Bernhard Gellrich, Aalen (DE); Franz Sorg, Aalen (DE); Stefan Xalter, Oberkochen (DE); Thomas Ittner, Aalen (DE)

(73) Assignee: Carl Zeiss SMT AG (DE)

( * ) Notice: Subject to any disclaimer, the term of this patent is extended or adjusted under 35 U.S.C. 154(b) by 0 days.

(21) Appl. No.: 09/956,715

(22) Filed: Sep. 19, 2001

(65) Prior Publication Data

US 2002/0048096 A1 Apr. 25, 2002

(30) Foreign Application Priority Data

Sep. 20, 2000 (DE) ........................................ 100 46 379

(51) Int. Cl.[7] .................................................. G02B 7/02
(52) U.S. Cl. ........................ 359/824; 359/290; 359/846
(58) Field of Search ........................ 359/222–24, 226, 359/230, 290–92, 846, 824; 372/22, 35, 70, 94

(56) References Cited

U.S. PATENT DOCUMENTS

| 4,202,605 A | | 5/1980 | Heinz .......................... 359/845 |
| 5,026,977 A | * | 6/1991 | Hubbard, Jr. ............. 250/201.9 |
| 5,428,482 A | | 6/1995 | Bruning et al. ............. 359/827 |
| 5,719,846 A | * | 2/1998 | Matoba et al. ......... 369/112.29 |
| 5,986,795 A | | 11/1999 | Chapman et al. ............ 359/224 |
| 6,411,426 B1 | * | 6/2002 | Meehan et al. ............. 359/291 |
| 6,496,466 B1 | * | 12/2002 | Lee et al. .............. 369/112.29 |
| 6,566,627 B2 | * | 5/2003 | Brandinger et al. ... 219/121.69 |
| 6,585,379 B2 | * | 7/2003 | Yokoyama et al. ........... 353/31 |

FOREIGN PATENT DOCUMENTS

| CH | 371906 | 10/1963 | |
| DE | 3406907 A 1 | 10/1984 | |
| DE | 198 25 716 A 1 | 12/1999 | |
| DE | 199 10 947 A 1 | 9/2000 | |
| EP | 0 053 463 A2 | 6/1982 | |
| EP | 0 230 277 A2 | 7/1987 | |
| EP | 0 964 281 A1 | 12/1999 | |
| EP | 1 209 500 A2 | 5/2002 | |
| RU | WO 97/09642 | 3/1997 | ............ G02B/5/10 |
| WO | WO 97/34171 | 9/1997 | ............ G02B/2/20 |

* cited by examiner

*Primary Examiner*—Jordan M. Schwartz
*Assistant Examiner*—Jessica Stultz
(74) *Attorney, Agent, or Firm*—Wells St. John P.S.

(57) ABSTRACT

In a system for specific deformation of optical elements in an imaging device, in particular in a projection exposure machine having a projection lens for micro-lithography, for the purpose of eliminating image errors or for active adjustment, piezoelectric elements are applied as actuators in the form of thin plates, films or layers to surfaces to be deformed, or integrated into them. In conjunction with an adaptronic servo loop having sensors, forces and/or moments are exerted on the optical elements for their specific deformation by means of a controlled activation of the piezoelectric elements as actuators.

45 Claims, 2 Drawing Sheets

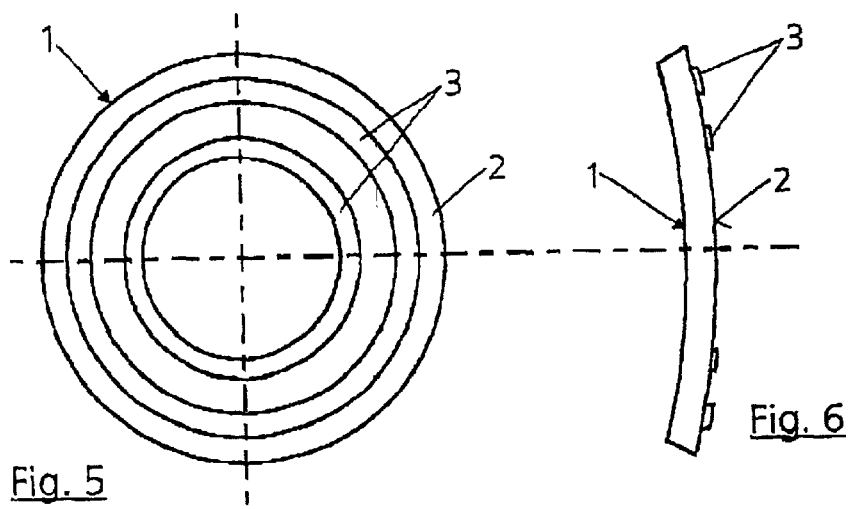
Fig. 5
Fig. 6
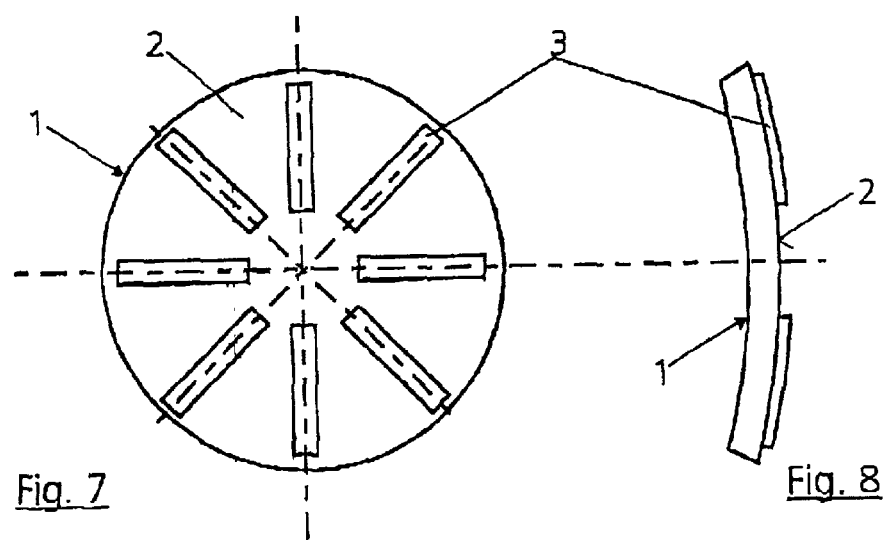
Fig. 7
Fig. 8
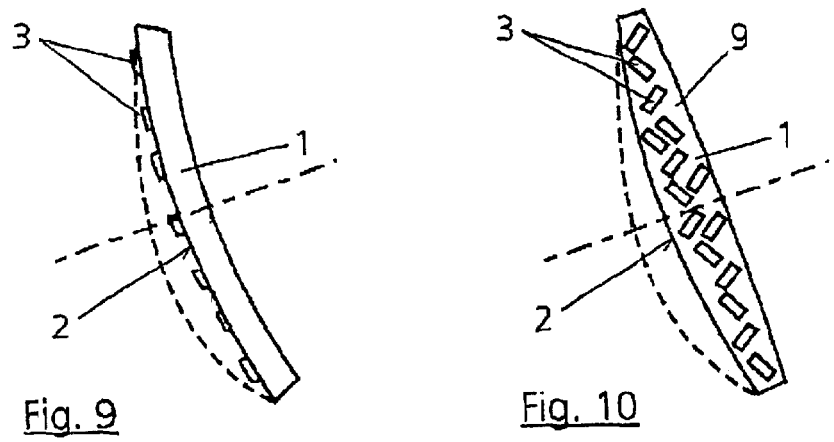
Fig. 9
Fig. 10

OPTICAL ELEMENT DEFORMATION SYSTEM

RELATED APPLICATIONS

This application relates to and claims priority to corresponding German Patent Application No. 100 46 379.7 filed on Sep. 20, 2000.

BACKGROUND OF THE INVENTION

The invention relates to an optical element deformation system in an imaging device for the purpose of eliminating image errors or for active adjustment.

Very high imaging accuracies are required in many optical fields, in particular in micro-lithography. The aim is to minimize image errors even more. One of the main causes of image errors in this case is deformations of the optical elements. Such deformations can be introduced via mounts or be produced by mounts. Weight forces on optical elements can also lead to deformations and thus to image errors.

Reference is made to WO 97/34171 in relation to the general prior art.

Moreover, the precise adjustment of an imaging device, for example a projection lens, also requires individual optical elements to be actively adjusted in order, for example, to compensate errors in the lens in this way, or else to correct mounting inaccuracies.

It is the object of the present invention to create a system of the type mentioned at the beginning with the aid of which specific deformations can be undertaken on an optical element in a very comprehensive way, and/or very specific and sensitive active adjustments are also possible.

SUMMARY OF THE INVENTION

According to the invention, this object is achieved by means of an optical element deformation system in an purpose of eliminating image errors wherein an optical element bears piezoelectric elements being applied as actuators in the form of thin plates, films or layers to surfaces of the optical element, whereby forces and/or moments are being exerted on the optical element for deformation in conjunction with a servo loop having at least one sensor, and by controlled activation of the piezoelectric elements as actuators.

According to the invention, piezoelectric elements are now used as actuators in the form of thin plates, films or layers which are fitted specifically to surfaces to be deformed, or integrated in them. A type of adaptronic servo loop is created in cooperation with sensors, as a result of which it is possible to examine detected deformations very precisely and to treat them appropriately. It is also possible in this way to introduce specific deformations very precisely into the optical element by means of forces and/or moments applied via the activation of the piezoelectric elements.

Although the use of piezoelectric elements is already fundamentally known in optics, for which purpose reference is made, for ;example, to WO 97/09642, U.S. Pat. No. 4,202,605 and U.S. Pat. No. 5,986,795, piezoelectric elements in the form of piezostacks respectively exerting deformation forces on optical elements, in the present case, by contrast, use is made specifically of thin plates, films or layers which are applied, for example in the form of coatings or via bonding methods, directly to the surfaces to be deformed and are arranged and aligned there for a specific purpose. At the same time, feedback via sensors and an adaptronic servo loop is provided in this case in such a way that it is possible in this way to act very precisely and within very small tolerances.

It is possible to use as sensors, for example, capacitive ranging sensors, interferometers and the like, or, in a very advantageous development of the intention, also piezoelectric elements in the form of thin plates, films or layers such as, for example, ceramic films, which act as sensors and cooperate with the piezoelectric elements as actuators. The sensors and actuators can be arranged in an alternating fashion for this, purpose.

In this solution according to the invention, piezoelectric elements are used in two regards, specifically firstly deformations or vibrations which occur lead to changes in length of the piezoelectric elements which are thereby correspondingly bent in the manner of a strain gauge. These changes in the piezoelectric elements generate voltages which are correspondingly detected and evaluated. The piezoelectric elements act in this way as sensors.

The reverse action is employed in the case of use as actuators: voltages are impressed via control lines on the piezoelectric elements and lead to corresponding changes in length and/or bending of the piezoelectric elements. These changes thereby initiate vibrations and/or deformations in the adjoining structure. In this case, the deformations are controlled or regulated via the adaptronic control circuit such that the desired effects are achieved in an extremely precise fashion such as, for example, the counteracting of detected deformations in order to comply with imaging accuracy, or compensating weight forces which lead to deformations or else to active adjustment, in order to counteract image errors detected or to correct them.

In an advantageous refinement of the invention, it can also be provided that, to damp vibrations, all the piezoelectric elements are configured as sensors in the quiescent state or in a phase of slight excitation of vibrations. Disturbances which occur are then packed up by all the piezoelectric elements, and all, or else only specific piezoelectric elements can then subsequently be activated as actuators by appropriate control action. This refinement has the advantage that it is not necessary to identify specific piezoelectric elements as sensors or as actuators. All that need be provided is an appropriate regulating or control device.

In a further advantageous refinement of the invention, it is possible, for example, for the deforming surface to be provided over its entire area, or virtually over its entire area with a piezoelectric layer or film. Structures are then shaped in this layer, for example using lasers. The most varied patterns can be created in this way. If the structures of the most varied type are respectively provided with terminals in this case, the most varied deformation zones or regions and intensities of deformation can be achieved at any desired sites by appropriate activation. It is then also possible in this case to control the individual structures completely separately, as a result of which completely diverse deformations and force effects can be achieved as a function of the desired corrections and/or results.

BRIEF DESCRIPTION OF THE DRAWINGS

Further advantageous refinements and developments of the invention emerge from the subclaims and from the exemplary embodiments described below in principle with the aid of the drawing, in which:

FIG. 5 shows a top view of a surface to be deformed, with annular piezoelectric elements, FIG. 6 shows a side view of FIG. 5, FIG. 7 shows a top view of a surface to be deformed, with radially extending piezoelectric elements, FIG. 8 shows a side view of FIG. 7, FIG. 9 shows a mirror in the case of which a deformation occurring owing to weight force is compensated, and FIG. 10 shows a lens in the case of which a deformation occurring owing to weight force is compensated.

DETAILED DESCRIPTION OF THE PREFERED EMBODIMENTS

Figure 1:
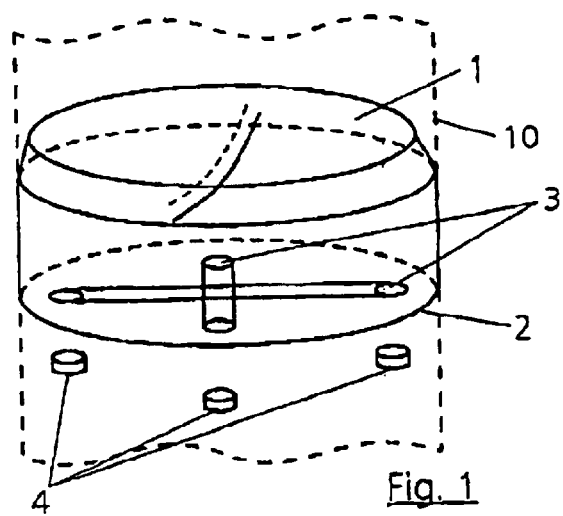
FIG. 1 shows a perspective illustration of the principle of a mirror with a rear which is to be deformed.

In accordance with FIG. 1, a mirror 1 is provided with piezoelectric elements 3 on its rear 2 as surface to be deformed. Two piezoelectric elements 3, which form the shape of a cross, are provided in accordance with the illustration.

Capacitive ranging sensors 4 at a short distance from the rear 2 are provided in order to detect the state of deformation. The piezoelectric elements 3 are piezoelectric ceramic films (PZT films) which are integrated in the mirror material or bonded onto the rear 2, and which can for example, have a thickness of a few $\mu$m. When the PZT films are being driven, they experience in accordance with the piezoelectric effect a strain which impresses forces on the mirror via the connection with the mirror substrate, and this leads to deformation of the mirror. Multifarious "patterns" are conceivable for generating any desired states of deformation in any desired angular orientation. As a rule, the piezoelectric elements will be provided for low corrugations, although these are not, of course, restrictive.

Figure 2:
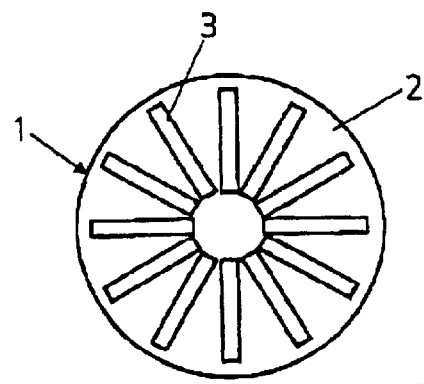
FIG. 2 shows a top view of a surface to be deformed.

Provided in FIG. 2 by way of example from the multiplicity of possible patterns are piezoelectric elements in strip form which, distributed appropriately over the periphery in a radial direction, run on the surface to be deformed and in this way produce a type of spoked form.

Figure 3:
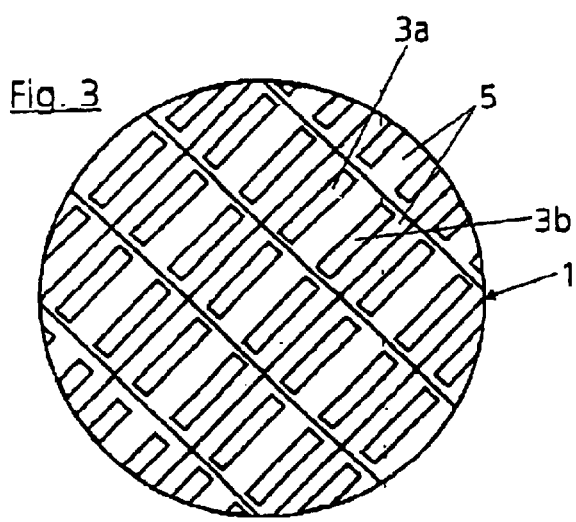
FIG. 3 shows a top view of a surface to be deformed, in another embodiment.

FIG. 3 shows a very abstract pattern with a multiplicity of sections 5 in each of which a piezoelectric element 3a is arranged as sensor, and the piezoelectric element 3b is arranged as actuator.

Figure 4:
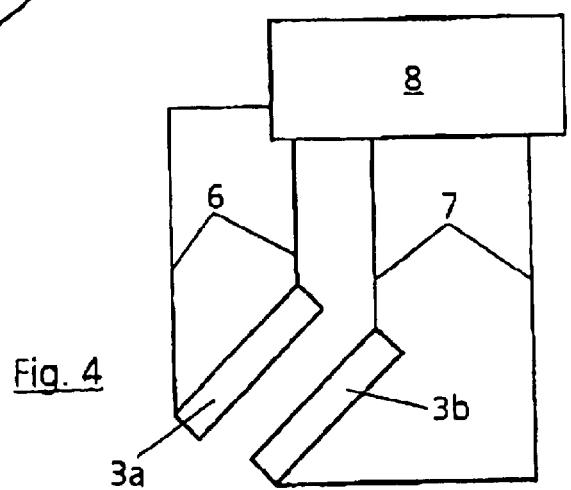
FIG. 4 shows an enlarged illustration of two piezoelectric elements in accordance with FIG. 3, once as actuator and once as sensor.

It may be seen from the enlarged illustration in FIG. 4 that the piezoelectric elements are provided as sensors 3a with control lines 6, and the piezoelectric elements 3b are provided as actuators with control lines 7. Control lines 6 and 7 make the connection to a computer/evaluation unit 8 and form an adaptronic servo, loop. In this case, of course, all the sensors 3a and actuators 3b are appropriately linked to one another via the evaluation and control unit 9. The pattern illustrated in FIG. 3 with the sensors 3a and the actuators 3b can be formed by bonding an appropriate multiplicity of individual piezoelectric elements. Alternatively, the entire surface to be deformed, in this case the rear 2 of the mirror 1, can be coated with a film, after which corresponding structures of arbitrary shape, contour and configuration can be introduced, for example by etching operations or by laser processing, thus producing a corresponding multiplicity of individual structures which are independent of one another and which are each provided with control lines 6 and 7.

Virtually any desired deformation can be achieved by means of such refinements. Such deformations can be in the nanometer range, for example.

If a lens is provided for a deformation as optical element instead of a mirror, the piezoelectric elements 3 must, of course, be arranged in regions which are not optically active. Furthermore, the peripheral surface of the lens is also available in this case for the purposes of deformation.

Two exemplary embodiments relating to specific deformation of a mirror 1 and by means of which the focus and/or the mirror focal length can be varied are provided in FIGS. 5 to 8. The aim is to obtain a mirror fox optical systems in particular for a wavelength of lambda$\geq$157 nm, which permits a mirror focal length which is to be varied in operation, in order in this way firstly to obtain a type of zoom system and, secondly, also to be able to use tracking of the focal length to correct system-internal changes in length such as, for example, temperature drift, aging phenomena, material fatigue, changes in pressure and the like. Use is made for this purpose of, for example, piezoelectric elements 3 which are applied in annular form to the underside 2 of the mirror (see FIGS. 5 and 6) or which run radially and produce a spoked shape (FIGS. 7 and 9). By, driving these elements, the surface of the mirror can be deformed specifically with the desired effect. Here, as well, the deformation is performed via an adaptronic servo loop having sensors, for example, likewise in the form of piezoelectric elements.

Both in the case of the exemplary embodiment according to FIGS. 1 to 3, and according to FIGS. 5 to 8, the piezoelectric elements 3 can also be used for active adjustment of deformation in order, for example, to raise the imaging accuracy of a projection exposure machine having a projection lens 10 (indicated only by dashes in FIG. 1) in which the optical element to be deformed is installed, this being done to improve the overall imaging accuracy, or to compensate errors occurring at another site.

Two examples are shown in FIGS. 9 and 10, specifically for a mirror 1 (FIG. 9) and for a lens 9 (FIG. 10), the aim in each case being to compensate weight effects at an angle to the vertical. In general, the optical axis is vertical in the case of semiconductor lenses, or parallel to gravity. In this position, the influence of gravity produces, predominantly rotationally symmetrical deformations of the optical elements, and thus also rotationally symmetrical image errors. However, it is also provided to position the optical axes of the elements horizontally or at a specific angle to the direction of gravity in lithographic systems. This produces deformations of the optical elements which are not rotationally symmetrical.

A force and/or a moment can be applied in each case to the appropriate optical element by activating the piezoelectric elements 3, which are applied in the form of PZT films. In this case, the magnitudes of the forces and moments to be applied are selected such that their action is directed opposite to the action of gravity, and the weight force effect is thereby eliminated or at least substantially reduced.

As may be seen from FIG. 9, for this purpose the piezoelectric elements 3 are bonded for this purpose onto the rear 2 of the mirror 1 and, when activated under control, neutralize the deformation by gravity, which is illustrated by dashes in a greatly exaggerated fashion in FIG. 9. In addition or instead of an arrangement on the rear 2 of the mirror 1, it is also possible for piezoelectric elements to be arranged in the edge region or on the peripheral wall of the mirror 1.

The deformation of the lens 9, reducing on the weight force, is reduced in a similar way in accordance with FIG.

10, by piezoelectric elements 3 which are arranged distributed over the periphery of the lens. Here, as well, the shape of a lens 9 deformed by the weight force is illustrated by dashes and in a greatly exaggerated fashion.

What is claimed is:

1. Optical element deformation system in an imaging device for the purpose of eliminating image errors wherein an optical element bears piezoelectric elements being applied as actuators in the form of thin plates, films or layers to surfaces of the optical element, whereby forces are being exerted on the optical element for deformation in conjunction with a servo loop having at least, one sensor, and by controlled activation of, the piezoelectric elements as actuators; and wherein capacitive distance sensors are provided as sensors which are connected to the piezoelectric elements as actuators via a servo loop/control circuit.

2. System according to claim 1, wherein at least one of said sensors is a piezoelectric sensor element, which is connected to the piezoelectric actuator elements via a servo control circuit.

3. System according to claim 1, comprising piezoelectric elements configured as sensors in a quiescent state or in a phase of slight excitation of vibrations, and activatable as actuators when disturbances occur.

4. System according to claim 1, wherein the piezoelectric elements are formed by ceramic films.

5. System according to claim 1, wherein the piezoelectric elements are applied in pre-selected patterns.

6. A mirror comprising a system according to claim 1, wherein piezoelectric actuator elements are sensors and are arranged on the rear or in the edge region of the mirror.

7. System according to claim 5, wherein for the purpose of change of focus or focal length variation, the piezoelectric elements are arranged in the form of spokes running in radial direction on the rear of the optical element.

8. A mirror according to claim 6, wherein for the purpose of change of focus or focal length variation, the piezoelectric elements are arranged on the rear in the form of rings of different diameters.

9. System according to claim 1, wherein the surfaces to be deformed are coated with piezoelectric elements over at least approximately their entire area, the piezoelectric elements being patterned for the purpose of specific deformation.

10. System according to claim 1, wherein for the purpose of eliminating deformations due to gravitation, the piezoelectric elements are orientated on the deformed surfaces in a fashion opposing the gravitation.

11. A mirror comprising a system according to claim 10, wherein the piezoelectric elements compensating the weight forces are arranged on the rear of said mirror.

12. System according to claim 10, wherein, given a lens as the optical element, the piezoelectric elements acting in a fashion directed opposite to the weight force are arranged and distributed over the periphery of the lens.

13. System according to claim 10, wherein, given a lens as the optical element, the piezoelectric elements acting in a fashion directed opposite to the weight force are arranged and distributed over the periphery of the lens and situated in optically inactive regions.

14. A projection exposure machine having a projection lens for micro-lithography comprising a system according to claim 1.

15. A projection exposure machine having a projection lens for micro-lithography according to claim 14, wherein the piezoelectric elements are provided as sensors, which are connected to the piezoelectric elements as actuators via a servo loop/control circuit.

16. A projection exposure machine having a projection lens for micro-lithography according to claim 14, wherein all the piezoelectric elements are configured as sensors in the quiescent state or in a phase of slight excitation of vibrations, and when disturbances occur all or some of the piezoelectric elements are activated as actuators.

17. A projection exposure machine having a projection lens for micro-lithography according to claim 14, wherein the piezoelectric elements are formed by ceramic films.

18. A projection exposure machine having a projection lens for micro-lithography according to claim 14, wherein the piezoelectric elements are applied in pre-selected patterns to the surfaces of the optical elements, which are to be deformed.

19. A projection exposure machine having a projection lens for micro-lithography according to claim 14, wherein, given a, mirror as the optical element, sensors and piezoelectric elements as actuators are arranged on the rear or in the edge region of the mirror.

20. A projection exposure machine having a projection lens for micro-lithography according to claim 17, wherein for the purpose of change of focus or focal length variation, the piezoelectric elements are arranged in the form of spokes running in the radial direction on the rear of the optical element.

21. A projection exposure machine having a projection lens for micro-lithography according to claim 18, wherein for the purpose of change of focus or focal length variation, the piezoelectric elements are arranged on the rear of the optical element in the form of peripheral rings of different diameters.

22. A projection exposure machine having a projection lens for micro-lithography according to claim 14, wherein the surfaces to be deformed are coated with piezoelectric elements over at least approximately their entire area, the piezoelectric elements being patterned for the purpose of specific deformation.

23. A projection exposure machine having a projection lens for micro-lithography according to claim 14, wherein for the purpose of eliminating deformations due to weight forces, the piezoelectric elements are orientated on the deformed surfaces in a fashion opposing the weight forces.

24. A projection exposure machine according to claim 22, wherein, given a mirror as optical element, the piezoelectric elements compensate the weight forces inherent in the mirror wherein the piezoelectric elements are arranged on the rear of said mirror.

25. A projection exposure machine according to claim 22, wherein, given a lens as the optical element, the piezoelectric elements acting in a fashion directed opposite to inherent weight forces in the lens are arranged and distributed over the periphery of the lens.

26. A projection exposure machine according to claim 22, wherein, given a lens as the optical element, the piezoelectric elements acting in a fashion directed opposite to inherent weight forces in the lens are arranged and distributed over the periphery of the lens and situated in optically inactive regions.

27. An optical element correction system comprising:
an optical element having a surface to be deformed;
a piezoelectric layer supported on the surface of the optical element and configured as an actuator to deform the surface;
control circuitry operatively coupled to the piezoelectric layer to activate the piezoelectric layer; and servo loop circuitry comprising capacitor distance sensors and operatively coupled to the control circuitry, the servo loop circuitry in sensing relation of deformation of the surface.

28. The system of claim 27, wherein the piezoelectric layer is integrated into the surface of the optical element.

29. The system of claim 27, wherein the piezoelectric layer comprise a thin plate applied to the surface of the optical element.

30. An optical element correction system comprising:
an optical element comprising a mirror and having a surface to be deformed;
first piezoelectric elements supported on the surface of the optical element and configured as actuators to deform the surface;
control circuitry operatively coupled to the first piezoelectric elements to activate the first piezoelectric elements;
servo loop circuitry comprising sensors and operatively coupled to the control circuitry, the servo loop circuitry in sensing relation of deformation of the surface, the sensors comprising second piezoelectric elements; and
wherein the second piezoelectric elements are arranged in the form of direction on a rear of the mirror.

31. Optical element deformation system in an imaging device wherein an optical element bears piezoelectric elements being applied as actuators to surfaces of the optical element, whereby forces are being exerted on the optical element for deformation in conjunction with a servo loop having at least one sensor, and by controlled activation of the piezoelectric elements as actuators;
wherein the imaging device comprises a projection exposure machine for micro-lithography and having a projection lens as the optical element; and
wherein capacitive ranging sensors are provided as sensors which are connected to the piezoelectric elements as actuators via a servo loop/control circuit.

32. System according to claim 31 wherein the at least one sensor comprises piezoelectric elements which are connected to the piezoelectric elements as actuators via a servo loop/control circuit.

33. System according to claim 31, wherein all the piezoelectric elements are configured as sensors in the quiescent state or in a phase of slight excitation of vibrations, and when disturbances occur, all or some of the piezoelectric elements are activated as actuators.

34. System according to claim 31, wherein the piezoelectric elements are formed by ceramic films.

35. System according to claim 31, wherein the piezoelectric elements are applied in pre-selected patterns to surfaces of the projection lens.

36. System according to claim 31, wherein the surfaces to be deformed are coated with piezoelectric elements over at least approximately their entire area, the piezoelectric elements being patterned for the purpose of specific deformation.

37. System according to claim 31, wherein deformations of a projection lens are due to weight forces, and wherein the piezoelectric elements are orientated on the deformed surfaces in a fashion opposing the weight forces.

38. System according to claim 31, wherein the piezoelectric elements are oriented to act in a fashion directly opposite to inherent weight forces in the projection lens and are arranged and distributed over the periphery of the projection lens.

39. System according to claim 31, wherein the piezoelectric elements are oriented to act in a fashion directly opposite to inherent weight forces in the projection lens and are arranged and distributed over the periphery of the projection lens in optically inactive regions.

40. Optical element deformation system in an imaging device for the purpose of eliminating image errors wherein an optical element bears piezoelectric elements being applied as actuators in the form of thin plates, films or layers to surfaces of the optical element, whereby forces are being exerted on the optical element for deformation in conjunction with a servo loop having at least one sensor, and by controlled activation of the piezoelectric elements as actuators;
wherein the piezoelectric elements are applied in pre-selected patterns; and
wherein for the purpose of change of focus or focal length variation, the piezoelectric elements are arranged in the form of spokes running in radial direction on the rear of the optical element.

41. Optical element deformation system in an imaging device for the purpose of eliminating image errors wherein an optical element bears piezoelectric elements being applied as actuators in the form of thin plates, films or layers to surfaces of the optical element, whereby forces are being exerted on the optical element for deformation in conjunction with a servo loop having at least one sensor, and by controlled activation of the piezoelectric elements as actuators;
wherein piezoelectric actuator elements are sensors and are arranged on the rear or in the edge region of the mirror; and
wherein for the purpose of change of focus or focal length variation, the piezoelectric elements are arranged on the rear in the form of rings of different diameters.

42. Optical element deformation system in an imaging device for the purpose of eliminating image errors wherein an optical element bears piezoelectric elements being applied as actuators in the form of thin plates, films or layers to surfaces of the optical element, whereby forces are being exerted on the optical element for deformation in conjunction with a servo loop having at least one sensor, and by controlled activation of the piezoelectric elements as actuators;
wherein the system comprises a projection exposure machine having a projection lens for micro-lithography; and
wherein capacitive ranging sensors are ranging sensors are provided as sensors which are connected to the piezoelectric elements as actuators via a servo loop/control circuit.

43. Optical element deformation system in an imaging device for the purpose of eliminating image errors wherein an optical element bears piezoelectric elements being applied as actuators in the form of thin plates, films or layers to surfaces of the optical element, whereby forces are being exerted on the optical element for deformation in conjunction with a servo loop having at least one sensor, and by controlled activation of the piezoelectric elements as actuators;
wherein the system comprises a projection exposure machine having a projection lens for micro-lithography; and
wherein piezoelectric elements are formed by ceramic films; and
wherein for the purpose of change of focus or focal length variation, the piezoelectric elements are arranged in the form of spokes running in the radial direction on the rear the optical element.

44. Optical element deformation system in an imaging device for the purpose of eliminating image errors wherein an optical element bears piezoelectric elements being applied as actuators in the form of thin plates, films or layers to surfaces of the optical element, whereby forces are being exerted on the optical element for deformation in conjunction with a servo loop having at least one sensor, and by controlled activation of the piezoelectric elements as actuators;

wherein the system comprises a projection exposure machine having a projection lens for microlithography;

wherein the piezoelectric elements are applied in preselected patterns to the surfaces of the optical elements, which are to be deformed; and wherein for the purpose of change of focus or focal length variation, the piezoelectric elements are arranged on the rear of the optical element in the form of peripheral rings of different diameters.

45. An optical element correction system comprising:

an optical element comprising a mirror and having a surface to be deformed;

first piezoelectric elements supported on the surface of the optical element and configured as actuators to deform the surface;

control circuitry operatively coupled to the first piezoelectric elements to activate the first piezoelectric elements;

servo loop circuitry comprising sensors and operatively coupled to the control circuitry, the servo loop circuitry in sensing relation of deformation of the surface, the comprising second piezoelectric elements; and wherein the second piezoelectric elements are arranged on a rear of the mirror in the form rings of different diameters.

\* \* \* \* \*